(12) United States Patent
Heuttner

(10) Patent No.: US 11,689,189 B2
(45) Date of Patent: Jun. 27, 2023

(54) DIGITAL PHASE SHIFTER

(71) Applicant: Cubic Corporation, San Diego, CA (US)

(72) Inventor: Steven Edward Heuttner, Tucson, AZ (US)

(73) Assignee: Cubic Corporation, San Diego, CA (US)

( * ) Notice: Subject to any disclaimer, the term of this patent is extended or adjusted under 35 U.S.C. 154(b) by 204 days.

(21) Appl. No.: 17/224,961

(22) Filed: Apr. 7, 2021

(65) Prior Publication Data

US 2021/0313968 A1 Oct. 7, 2021

Related U.S. Application Data

(60) Provisional application No. 63/006,254, filed on Apr. 7, 2020.

(51) Int. Cl.
| | | |
|---|---|---|
| *H03H 17/08* | (2006.01) | |
| *H01P 3/08* | (2006.01) | |
| *H03H 11/16* | (2006.01) | |

(52) U.S. Cl.
CPC ............... *H03H 17/08* (2013.01); *H01P 3/08* (2013.01); *H03H 11/16* (2013.01)

(58) Field of Classification Search
CPC ........ H03H 17/08; H03H 11/16; H03H 11/20; H01P 3/00; H01P 3/08

USPC ....... 327/231, 233, 234, 235, 237, 238, 250, 327/251, 252, 253, 254, 255, 256

See application file for complete search history.

(56) References Cited

U.S. PATENT DOCUMENTS

| | | | | |
|---|---|---|---|---|
| 7,498,903 | B2 * | 3/2009 | Kamenopolski | ........ H01P 1/185 333/139 |
| 9,319,021 | B2 * | 4/2016 | Ehyaie | ................... H03H 7/185 |

* cited by examiner

*Primary Examiner* — Hai L Nguyen
(74) *Attorney, Agent, or Firm* — Mughal IP P.C.

(57) ABSTRACT

Phase shifters such as networks that can be used in MMIC (Monolithic Microwave Integrated Circuit) and hybrid digital phase shifters, for low loss, wide bandwidth, and high linearity. A digital phase shifter includes input port for receiving signals and output ports for transmitting the signals. Multiple transmission lines are arranged between the input and output ports of the phase shifter. The transmission lines are arranged in a ring with first pair of the transmission lines which are arranged in series in a first path and second pair of the transmission lines arranged in series in a second path. One of the transmission lines of the first and second pairs include quarter-wave hybrid coupled line with coupled-ports and through-ports terminated in short-circuit. Hybrid coupled line can be a Lange coupler with or without RF crossover.

20 Claims, 13 Drawing Sheets

DIGITAL PHASE SHIFTER

CROSS-REFERENCE TO RELATED APPLICATIONS

This application claims the benefit of and is a non-provisional of U.S. Provisional Application Ser. No. 63/006,254 filed on Apr. 7, 2020, which is hereby expressly incorporated by reference in its entirety for all purposes.

BACKGROUND

This disclosure relates in general to phase shifters and not by way of limitation to networks that can be used in Monolithic Microwave Integrated Circuit (MMIC) and hybrid digital phase shifters, for low-loss, wide bandwidth, and high linearity.

Low-loss phase shifters can be used in passive electronically scanned arrays (ESA), however, power consumption increases in the event of passive ESA deployed as a radar. 180-degree hybrid ring couplers, so-called rat-race couplers have been used in 180-degree digital phase shifters. Such networks are relatively large (the perimeter of the ring being ¾ wavelength at center frequency) with four ports coupled to ring sections of ¼, ¼, ¼ and ¾ wavelengths, 90, 90, 90 and 270 electrical degrees. Moreover, since passive ESAs offer reduced functionality compared to active ESAs, a phase shifter used in a passive ESA is also of low-cost.

SUMMARY

Phase shifters such as networks that can be used in MMIC (Monolithic Microwave Integrated Circuit) and hybrid digital phase shifters, for low loss, wide bandwidth, and high linearity. A digital phase shifter includes input port for receiving signals and output ports for transmitting the signals. Multiple transmission lines are arranged between the input and output ports of the phase shifter. The transmission lines are arranged in a ring with first pair of the transmission lines which are arranged in series in a first path and second pair of the transmission lines arranged in series in a second path. One of the transmission lines of the first and second pairs include quarter-wave hybrid coupled line with coupled-ports and through-ports terminated in short-circuit. Hybrid coupled line can be a Lange coupler with or without RF crossover.

In one embodiment, the disclosure provides a low-loss/high-linearity digital phase shifters used in passive electronically steerable antennas, such as phased arrays, and can also be used for phase alignment in solid-state power amplifiers. A first exemplary network configuration can provide a 180-degree digital phase shifter using a modified broad-band 180-degree ring hybrid technique. Here the three-quarter wavelength section in a ring hybrid rat-race can be replaced by a coupled quarter-wave line (90-degrees) that is terminated in short-circuits which can provide an additional 180-degree phase length. The 180-degree digital phase shifter of the disclosure can be 33% smaller than a conventional rat-race coupler and can provide a much wider bandwidth. The 180-degree digital phase shifter can provide broadband phase response.

In another embodiment, the disclosure provides a reflection-type digital phase shifter that can use a quadrature coupler with terminations. This network can be applied to any phase shift value targeted for 90-degree. The 90-degree phase shifter can limits the performance in multi-bit digital phase shifters. A coupled line 3-dB coupler can be used (a Lange coupler, with or without an RF crossover). The reflection-type digital phase shifter of the disclosure uses terminations that provide capacitive or inductive loading to achieve a prescribed phase shift with a single control voltage. Open-circuited stubs can be used as matching elements in the terminations, but could be replaced with metal-insulator-metal capacitors or gap capacitors to achieve similar results. The reflection-type digital phase shifters of the disclosure provides a combination of simplicity (single control voltage), wide bandwidth, low loss and high linearity that has not previously been demonstrated for 90-degree digital phase shifters.

Both of the exemplary 180-degree and reflection-type phase shifters can be designed for high linearity and low loss, owing to the use of relatively large FETs which can be used as switches. Using a low-voltage GaAs pHEMT process, 0.1 dB compression at output should be ~27 dBm for each phase shifter. Cascaded into a three-bit phase shifter, insertion loss for a 14-21.5 GHz design is predicted to be 2.5-dB. Output power of more than 250 mW is predicted.

Further areas of applicability of the disclosure will become apparent from the detailed description provided hereinafter. It should be understood that the details description and specific examples, while indicating various embodiments, are intended for purposes of illustrations only and are not intended to necessarily limit the scope of the disclosure.

BRIEF DESCRIPTION OF THE DRAWINGS

This disclosure is described in conjunction with the appended figures.

In the appended figures, similar components and/or feature can have the same reference label. Further, various components of the same type can be distinguished by following the reference label by a second alphabetical label that distinguishes among the similar components. If only the first reference label is used in the specification, the description is applicable to any one of the similar components having the same first reference label irrespective of the second reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It is understood that various changes can be made in the function and arrangement of elements without departing from the spirit and scope as set forth in the appended claims.

Figure 1:
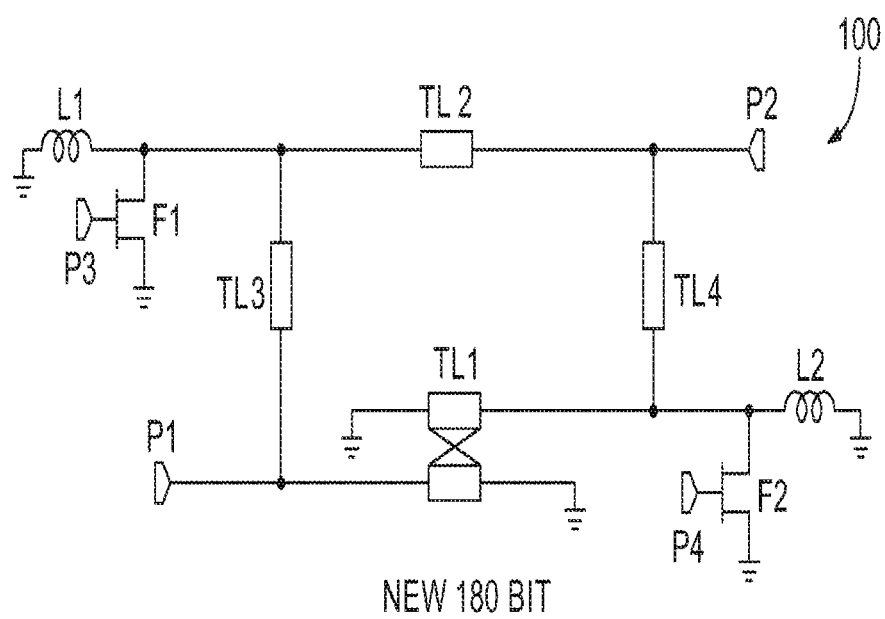
FIG. 1 schematically illustrates an exemplary configuration of a 180-degree digital phase shifter using primary elements in accordance with the disclosure.

Referring to FIG. 1, an exemplary configuration of a 180-degree digital phase shifter 100 in accordance with the disclosure is shown. The digital phase shifter 100 has a pair of FETs F1, F2 that are used to steer a signal in different directions around the ring hybrid from port P1 to port P2, the FETs F1, F2 accompanied by inductors L1, L2 that resonate their capacitance. The ring includes a number of transmission lines in series TL1, TL2, TL3, TL4 disposed therearound, with TL1 and TL4 disposed in series in a first path of the ring between P1 and P2, and TL2 and TL3 disposed in a second path of the ring between P1 and P2. TL1 includes a quarter-wave 3 dB hybrid coupled line (such as a Lange coupler, with or without the RF crossover) with coupled-ports and through-ports terminated in short-circuits. Short-circuits reflect the split signal with a natural 180-degree phase shift at all frequencies, thereby creating a "phase inverter". Recombining the reflected signals, transmission line TL1 behaves as if it were 270 degrees in length, 90 degrees owing to its physical length and 180 degrees owing to the phase inversion. Ports P3 and P4 represent gate control terminals to FETs F1 and F2 and are decoupled from the RF signal path.

Figure 2A:
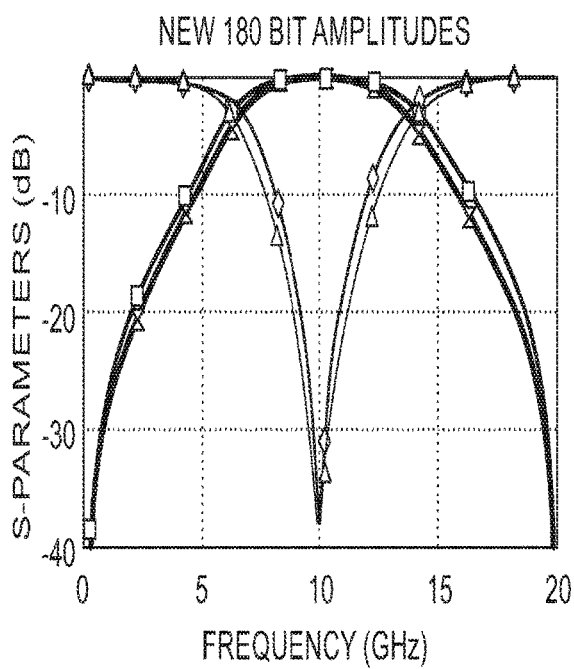
FIGS. 2A-2B compare amplitude response performance of the 180-degree digital phase shifter of FIG. 1 with a rat-race phase shifter, respectively.
Figure 2B:
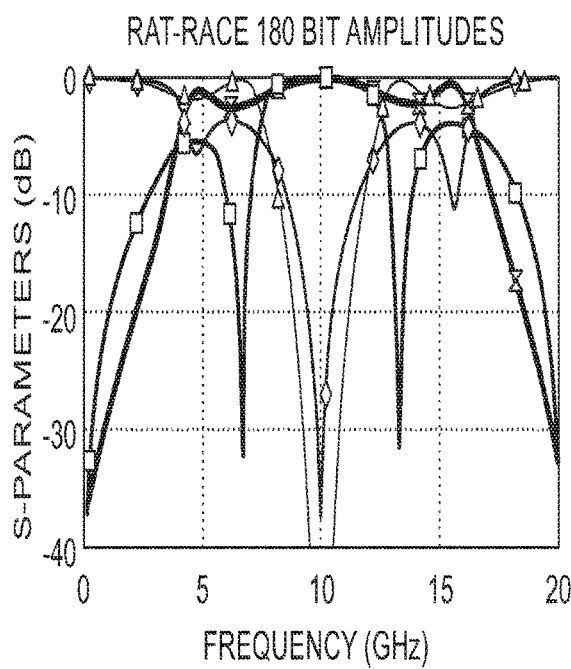
Figure 3:
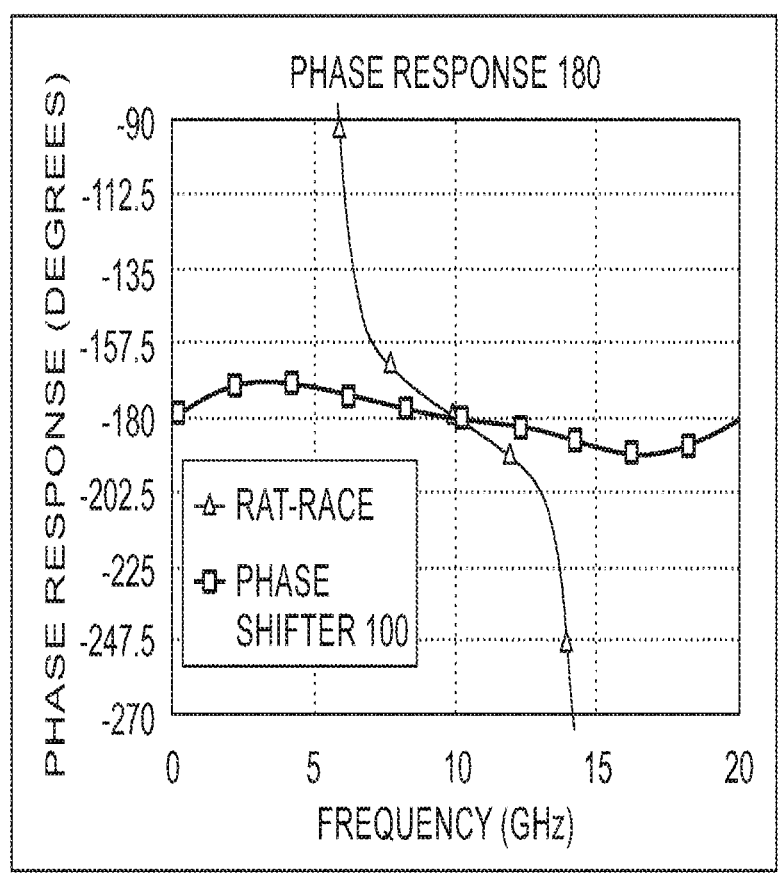
FIG. 3 compares the phase response of the 180-degree digital phase shifter of FIG. 1 with a rat-race phase shifter.

The calculated amplitudes of S11 and S21 for the 180-degree phase shifter 100 using primary lumped elements are illustrated in FIG. 2A, with comparative plots for a traditional rat-race circuit shown in FIG. 2B. The traditional rat-race circuit provides 20% bandwidth to achieve 20 dB return loss (9 to 11 GHz), as shown in FIG. 2B, while the 180-degree digital phase shifter 100 in accordance with the disclosure can achieve 40% bandwidth (8 to 12 GHz), as shown in FIG. 2A. In both cases, certain components will affect performance. The phase response of a traditional rat-race 180-degree phase shifter and the 180-degree digital phase shifter 100 of the disclosure are compared in FIG. 3. Here, the advantage of coupling to a short circuit to achieve 180-degree phase response with the digital phase shifter 100 is evident. The 180-degree phase shift of the digital phase shifter 100 of the disclosure performs well beyond its useful bandwidth (performance is limited by the amplitude response).

Figure 4:
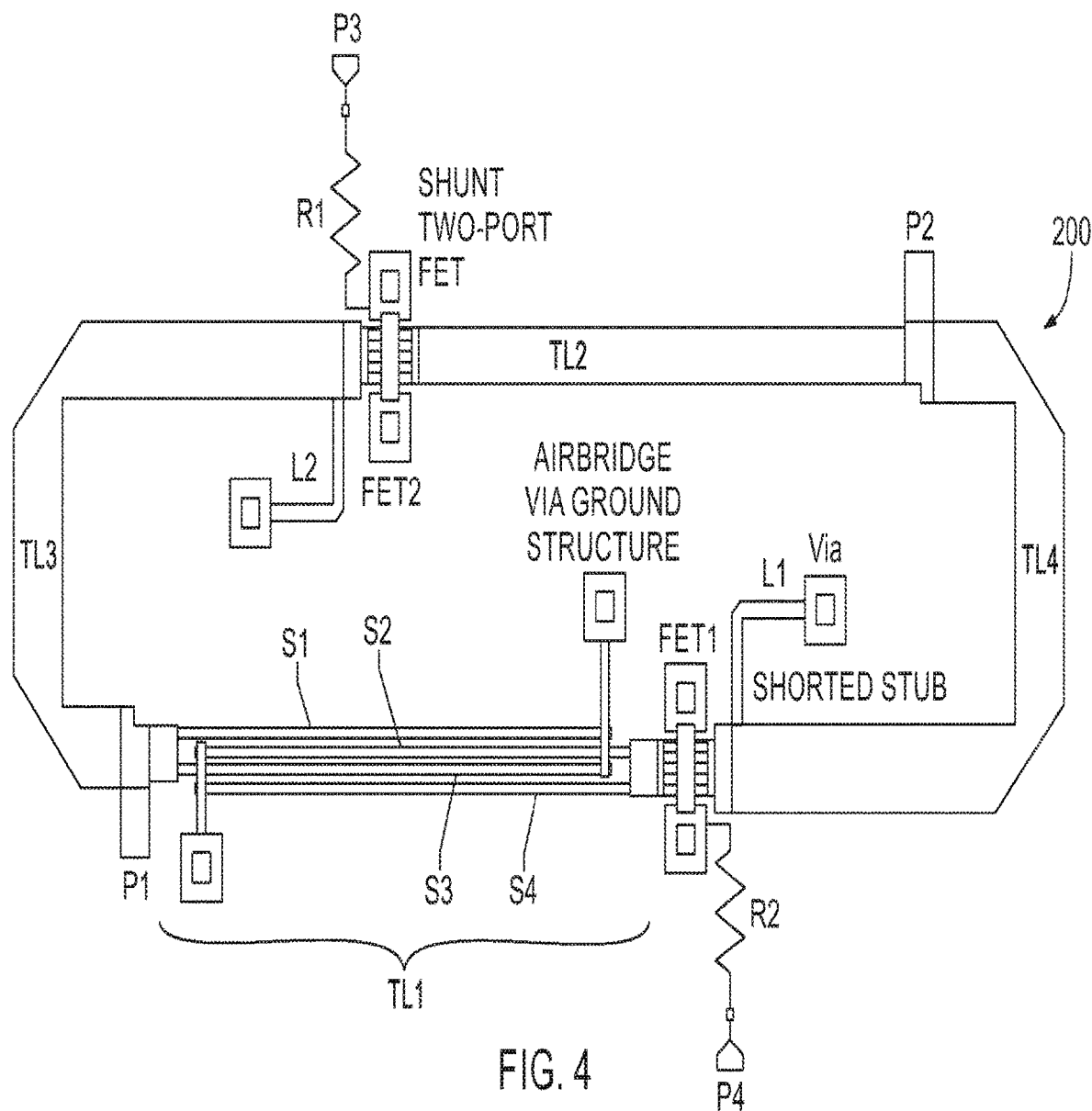
FIG. 4 schematically illustrates an exemplary physical MMIC layout of the 180-degree digital phase shifter of FIG. 1.
Figure 5:
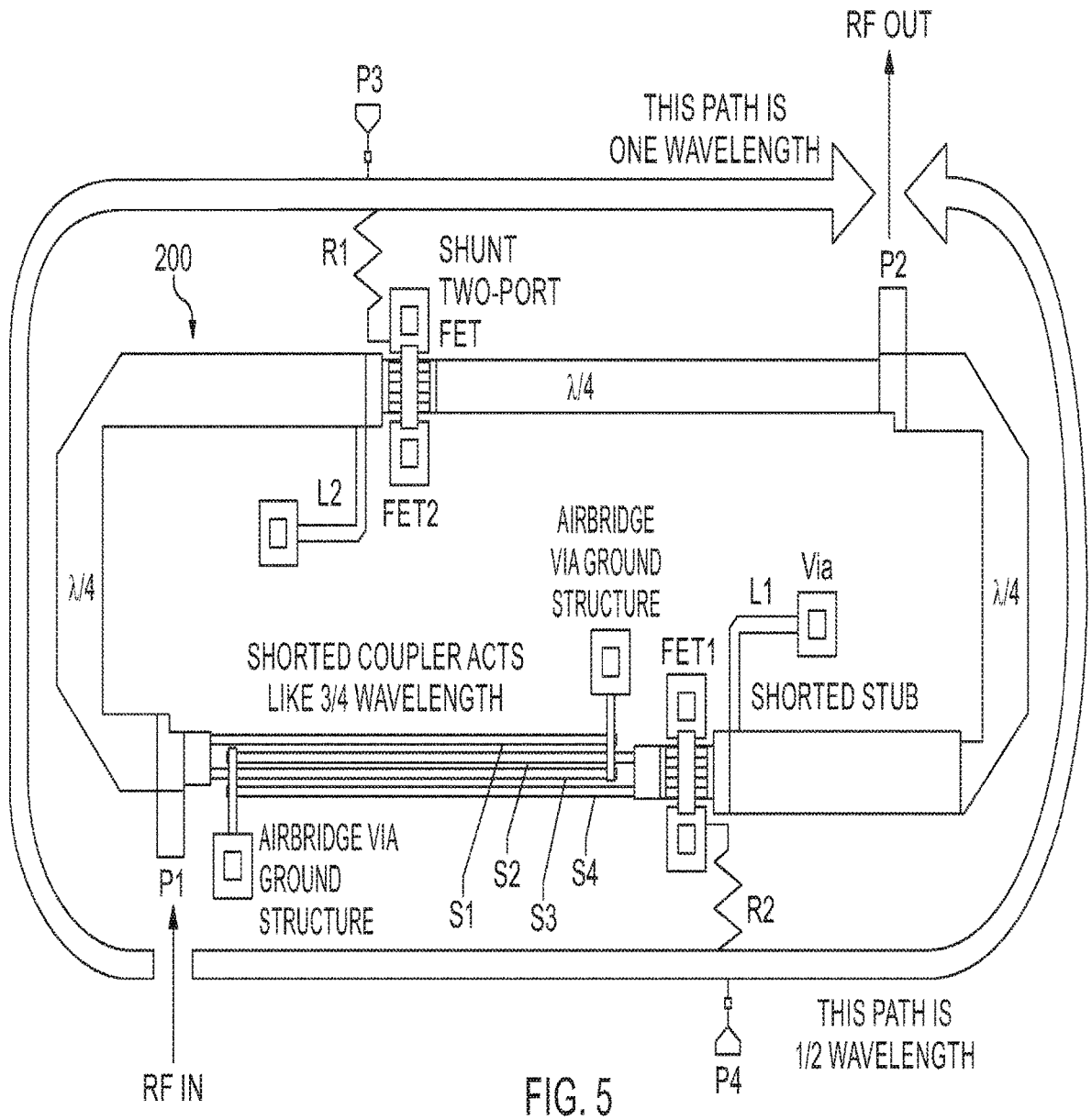
FIG. 5 schematically illustrates the layout of FIG. 4 with additional explanatory text.

A Monolithic Microwave Integrated Circuit (MIMIC) implementation 200 of the 180-degree digital phase shifter 100 is shown in FIG. 4. Here, a 3 dB coupler is provided corresponding to TL1 in FIG. 1 and comprises four thin metal strips S1, S2, S3, S4, similar to a Lange coupler but without the RF cross-over which is not needed. At the ends of the coupler TL1, an airbridge structure connects pairs of strips S1/S2, S3/S4 to ground vias to form the phase invertors. Similarly, other embodiments can have different configurations of 2-bits such as 6, 8, 10. Shunt, two-port FETs F1, F2 are used to steer the RF signal clockwise or counterclockwise. Ports P3 and P4 are connected to FET gate terminals through decoupling resistors R1 and R2 to control the circuit. Because the shunt FETs F1, F2 contain parasitic capacitance in the OFF state, shorted stubs S1, S2 are used to resonate the FETs F1, F2 to look like open circuits in their off states. From the RF IN terminal P1, the counter-clockwise direction is 180 degrees longer than the clockwise path for the MIMIC implementation 200, shown in FIG. 5. Alternating between the two paths around the ring effects the 180-degree phase shift. Exemplary values for the elements shown in FIG. 4 are provided in Table 1. These dimensions correspond to a design using gallium arsenide (GaA) as a 100 μm thick microstrip substrate.

TABLE 1

| Transmission line | Width | Equivalent length |
| --- | --- | --- |
| TL1 (coupler) | Strip width 18 μm | 1195 μm |
|  | Gap 10 μm |  |
| TL2 | 72 μm | 1225 μm |
| TL3 | 118 μm | 1410 μm |
| TL4 | 130 μm | 1360 μm |
| L1 | 10 μm | 305 μm |

Figures 6A, 6B:
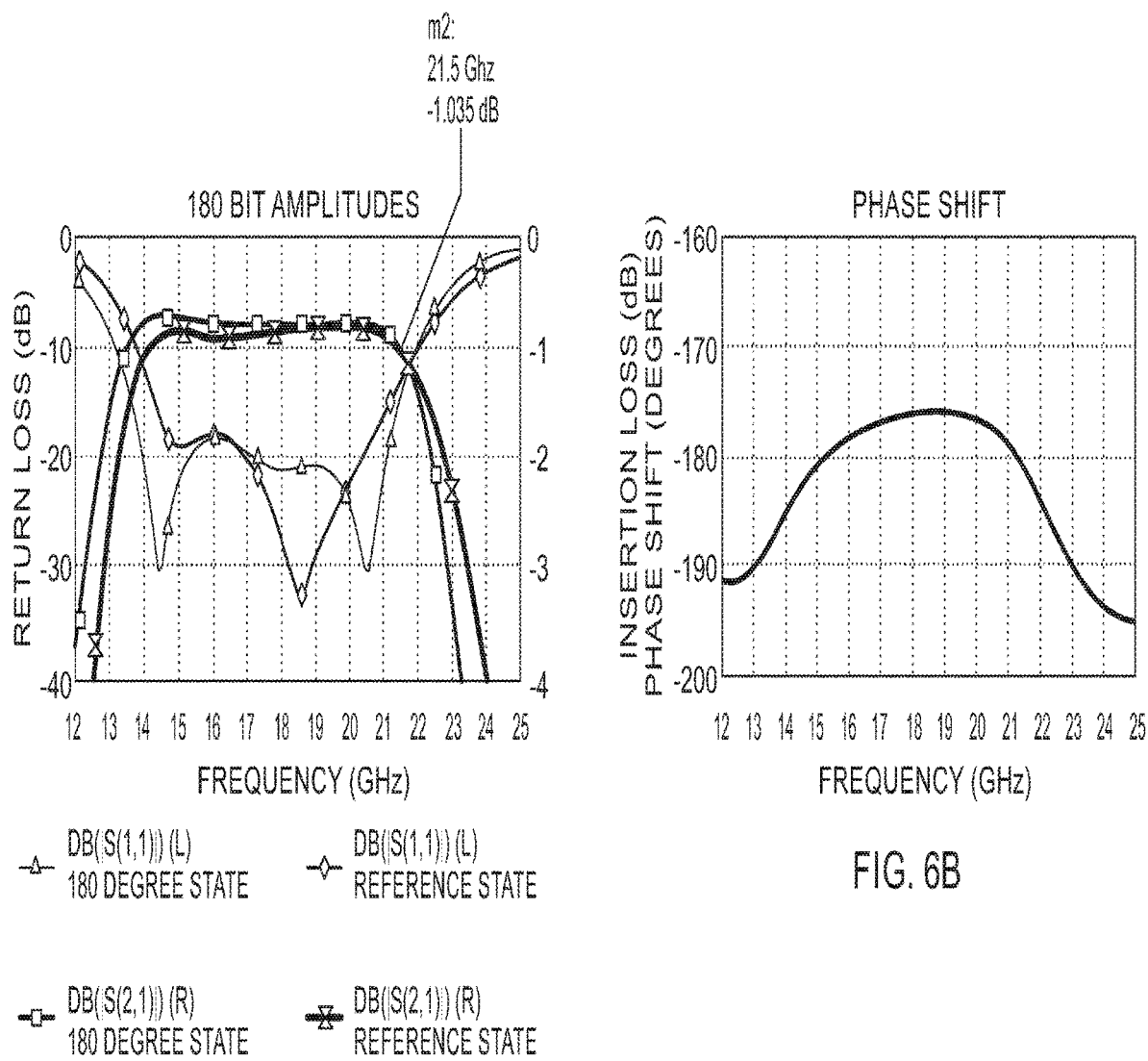
FIGS. 6A-6B illustrates predicted performance at Ku-band for the 180-degree digital phase shifter of FIG. 5.

The MMIC implementation 200 shows 5 degrees maximum phase error over 14 to 21.5 GHz (42% bandwidth), as plotted in FIG. 6. This model includes all loss mechanisms and shows less than 1 dB loss over the same bandwidth.

Reflection-Type Digital Phase Shifter

In a second exemplary configuration of the disclosure, a reflection-type digital phase shifter 300 can be provided. The reflection-type digital phase shifter 300 can be configured to provide 90-degree phase shift, however, it can also be configured to provide smaller phase shifts such as 45 and 22 degrees, and even 180-degrees for use in a multi-bit digital phase shifter.

In previous reflection phase shifters, a 90-degree or quadrature hybrid coupler (for example, a Lange coupler) is used to return a signal from two highly reflective, identical terminations. The terminations are made to change a reflection coefficient angle, thereby providing phase shift which is often proportional to frequency (a form of time delay). A single voltage source derives two phase states in a reflection phase shifter, however, 180-degree digital phase shifter 100 operates with two voltage sources. Analog phase shifters of the reflection type uses varactor diodes that are continuously varied. Digital phase shifters are possible where the terminations have two or more discrete states.

Figure 7:
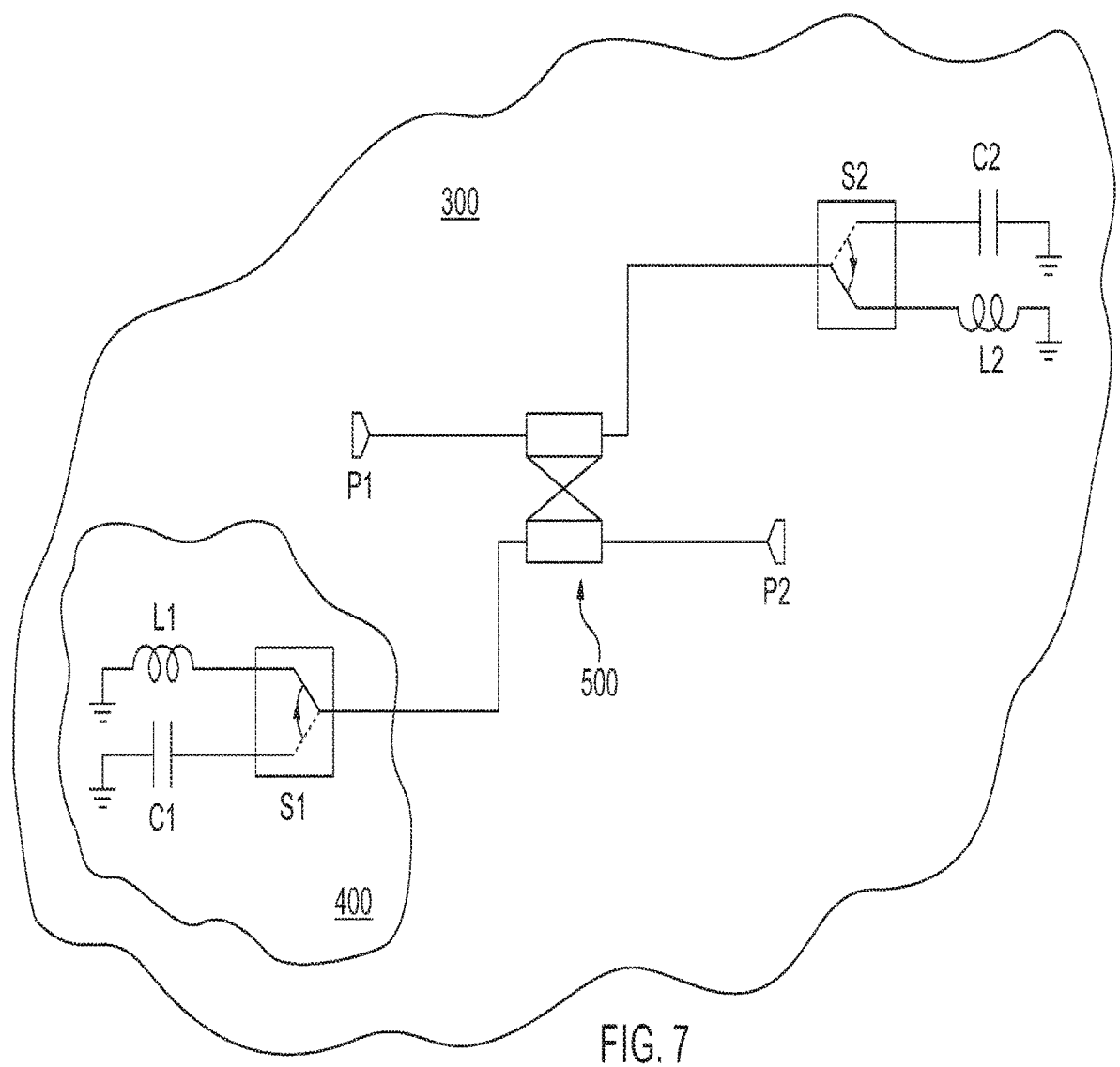
FIG. 7 schematically illustrates an exemplary configuration of a reflection-type phase shifter in accordance with the disclosure, with the switches used to provide capacitive terminations and inductive terminations.
Figure 8:
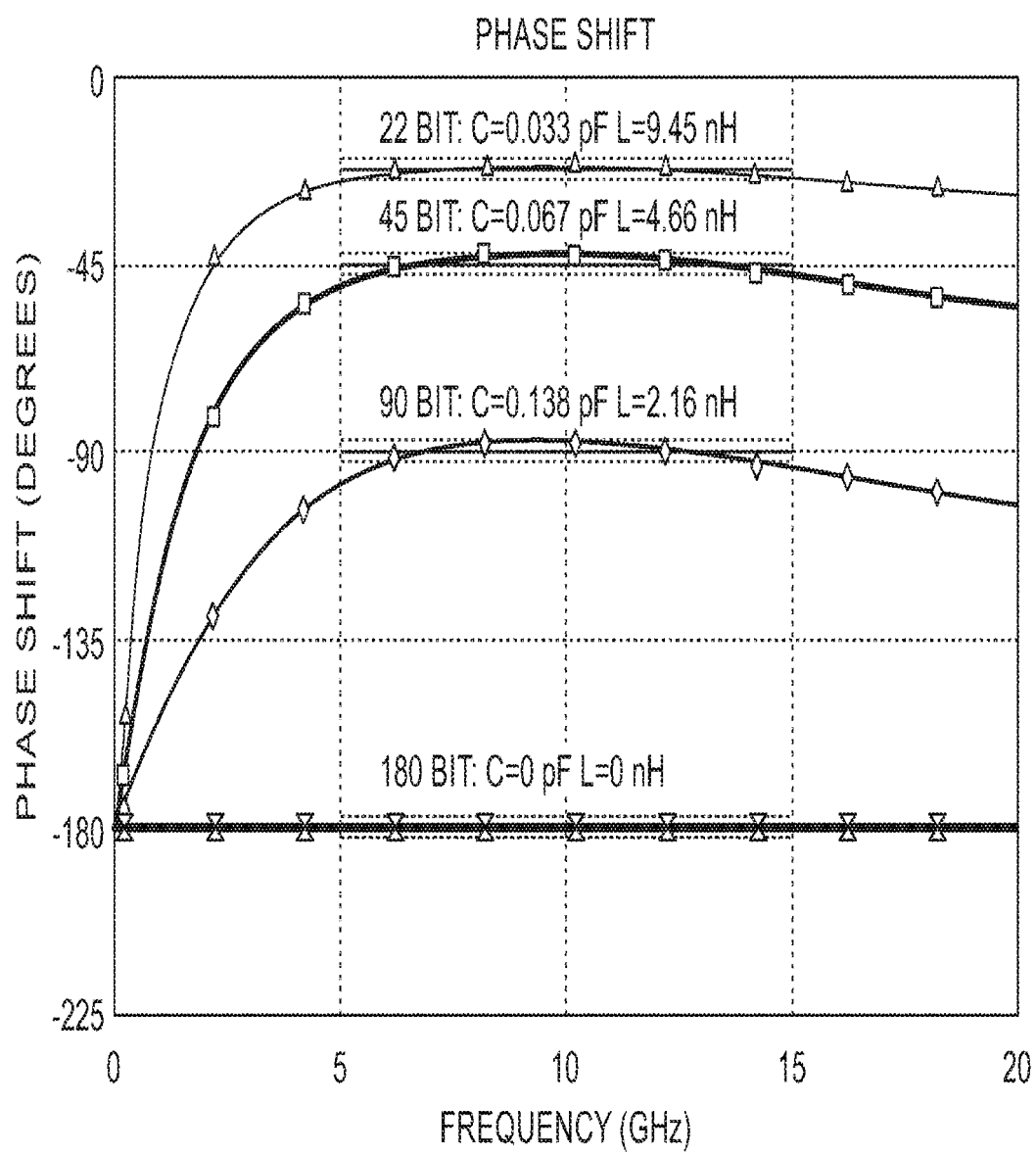
FIG. 8 illustrates phase shift performance for the device of FIG. 7 applied to 180, 90, 45 and 22-degree phase shifters.

A reflection-type phase shifter 300 of the disclosure can use terminations 400 that behave like shunt inductors in one state and shunt capacitors in the other state to provide phase shift that can be nearly flat with frequency, FIG. 7 and FIG. 8. The bandwidth can ultimately be limited first by how the terminations are, and second by the bandwidth of the coupler. Shown in FIG. 7 is a schematic of an phase shifter 300, where switches S1, S2 are used to provide capacitive terminations C1, C2 in one state and inductive terminations in the other L1, L2.

Values can be optimized to provide flat phase shift for 22, 45, 90 and 180 cases, shown in FIG. 8 with the values for C1, C2, L1, L2 noted in the legend for each curve; note C1=C2, and L1=L2. Also, note that in the 180 case, the inductors L1, L2 and capacitors C1, C2 have values that can become zero, and the phase response is perfect. However, in each case the characteristics of the switching device and the lumped elements can be considered.

Any switching device has parasitic elements that prevent response. In MMICs using FETs as switching devices, the principal parasitics are off-capacitance ($C_{OFF}$) and on-resistance ($R_{ON}$). MMIC processes are ranked by a switching figure of merit, FOM, which is the frequency at which the capacitive reactance ($X_C=1/(2\pi f C_{OFF})$) is equal to the on-resistance $R_{ON}$.

$$FOM = \frac{1}{2\pi R_{ON} C_{OFF}} \text{ (units of frequency)}$$

Typically, inexpensive GaAs processes show FOM of ~300 GHz. The best GaN processes have shown FOM as high as 2000 GHz. Higher FOM translates to lower loss and wider bandwidth, and higher frequency capability.

However, a switch and inductor/capacitor termination 400, such as that of FIG. 7 and FIG. 8, can be created from actual discreet components. To make a low loss/high-linearity switch, typically, the switch FET S1, S2 operates with a few ohms of resistance in on state. For a 500 GHz FOM (an exemplary GaAs pHEMT process currently in production), 2 ohms translates to ~100 ohms of reactance in the capacitive state at 10 GHz, and ~50 ohms at 20 GHz. This is a considerable parasitic to deal with. The disclosure provides the termination 400 with an inductive state and a capacitive state.

Figure 9A:
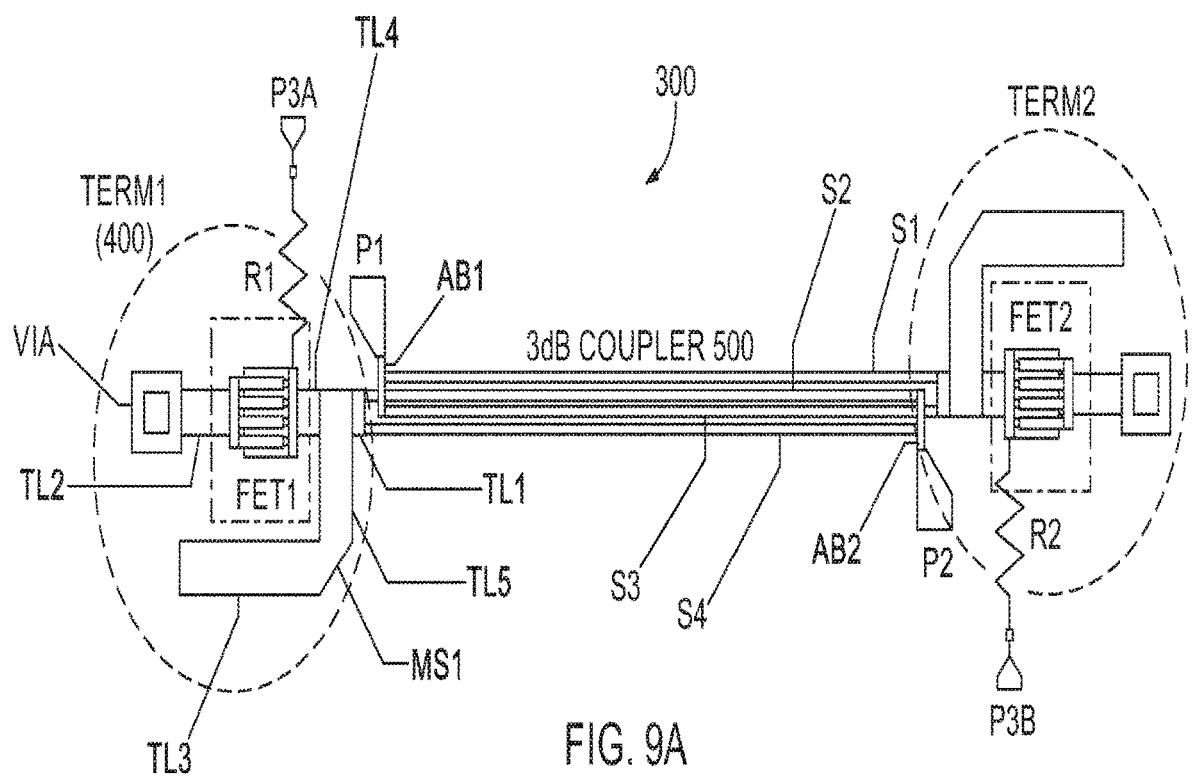
FIG. 9A illustrates a physical schematic of a reflection phase shifter employing a termination for a 90-degree phase shifter implementation of the device of FIG. 7.
Figure 9B:
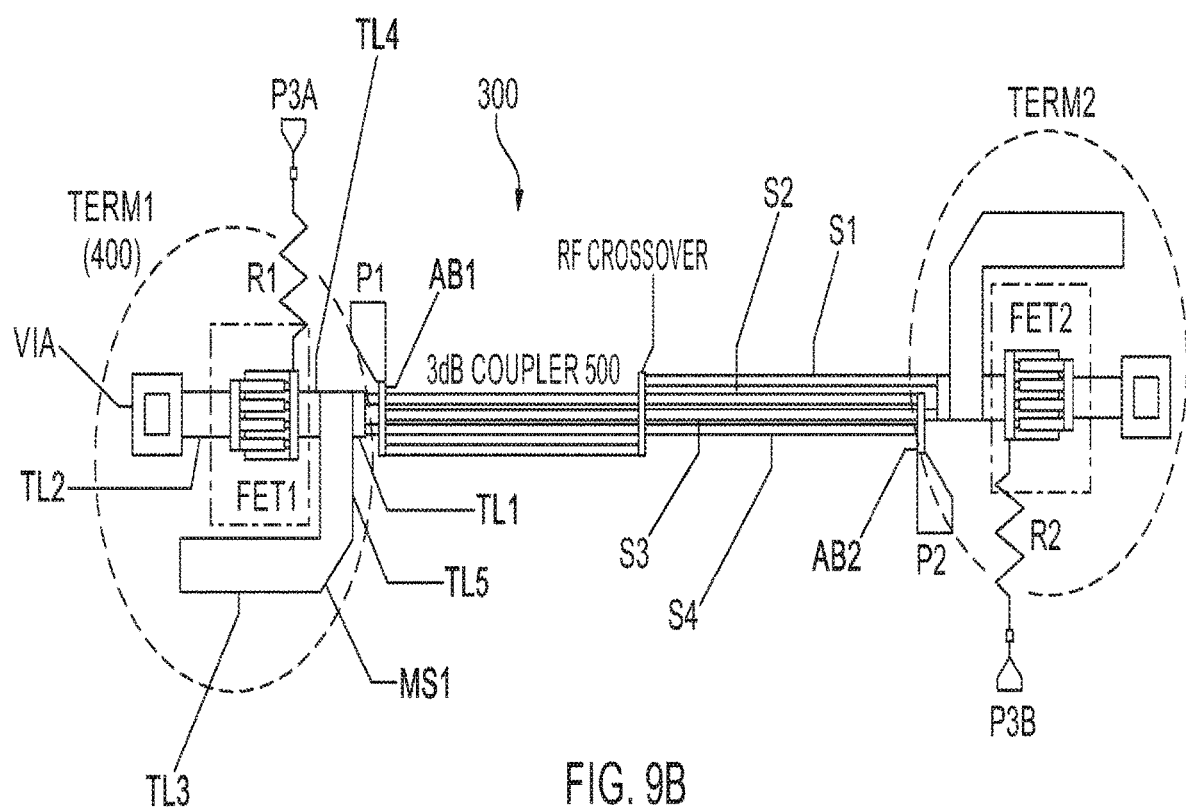
FIG. 9B illustrates an alternative layout of FIG. 9A using an RF crossover in the hybrid coupler.

An exemplary circuit layout of a reflection-type phase shifter 300 in accordance with the disclosure, and its termination 400 that provides a capacitive and inductive state, is shown in FIGS. 9A-9B. In FIGS. 9A-9B the inductor L1 or L2 of FIG. 7 is replaced with a transmission line TL2 that has high impedance and is terminated with a ground via (also providing inductance), and the capacitor C1 or C2 is provided as a combination of an open-circuited stub and switches FET1, FET2 providing off capacitance. The open-circuited stub can include transmission lines TL3 and TL5 along with bend MS1 and can be used as a tuning element in the termination 400. The bend MS1 is only necessary to compact the design. (Transmission lines TL1 and TL4 are short interconnect lines and have little effect on performance.) Exemplary values for the elements in FIGS. 9A-9B are provided in Table 2. These dimensions correspond to a design using gallium arsenide (GaAs) as a 100 μm thick microstrip substrate.

| Transmission line | Width | Equivalent length |
|---|---|---|
| Coupler 500 | Strip width 11 μm<br>Gap 10 μm | 1113 μm |
| TL1 | 50 μm | 27 μm |
| TL2 | 50 μm | 100 μm |
| TL3 | 67 μm | 288 μm |

-continued

| Transmission line | Width | Equivalent length |
|---|---|---|
| TL4 | 50 μm | 43 μm |
| TL5 | 67 μm | 100 μm |

In addition to the terminations 400, the reflection phase shifter 300 can include a 3 dB coupler 500 comprised of metal strips S1, S2, S3 and S4, which can be connected to ports P1 and P2 via airbridges AB1, AB2. Switches FET1, FET2 can be controlled through ports P3A and P3B through decoupling resistors R1 and R2. The open-circuited stub TL3, MS1 and TL5 could also be replaced with a thin-film or edge-coupled capacitor to achieve similar results.

Figure 10:
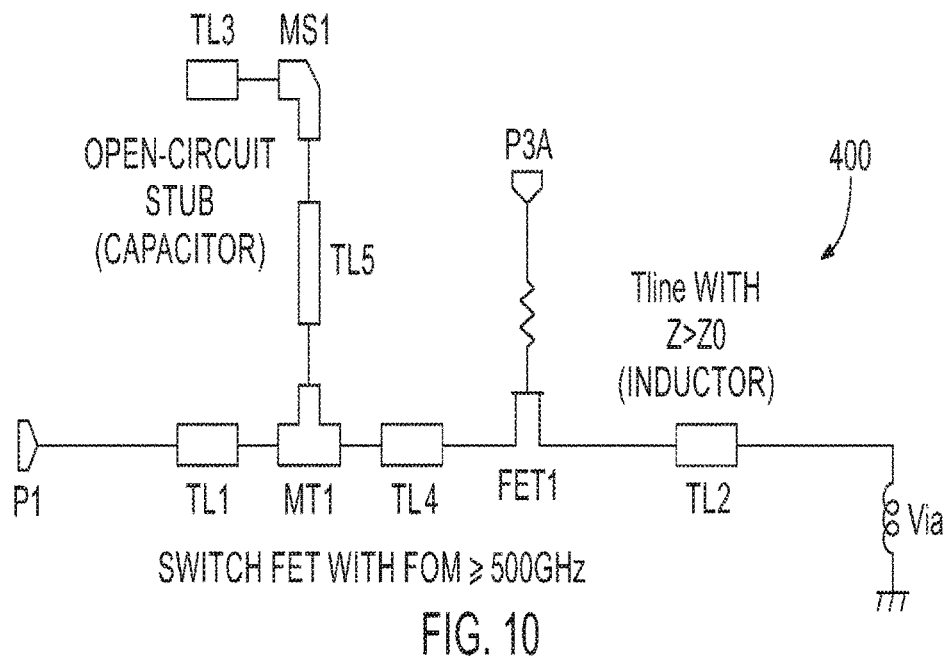
FIG. 10 schematically illustrates a physical schematic of the reflection termination.
Figures 11A, 11B, 11C:
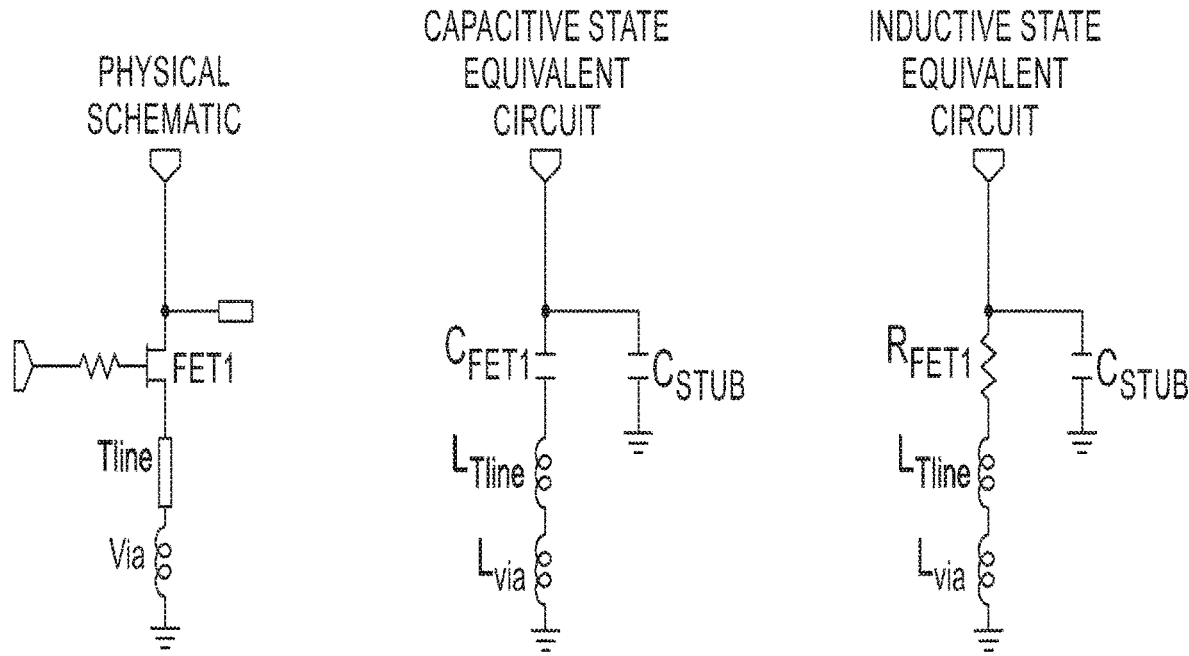
FIG. 11A-11C illustrates the physical termination to its capacitive and inductive equivalents.

FIG. 10 provides a schematic illustration of the termination 400 showing elements that control the operation, including the switch FET1, the open-circuited stub (TL3, MS1 and TL5) and other details. FIGS. 11A-11C illustrates how termination 400 acts to achieve a capacitive state and an inductive state. FIG. 11A is a simplified schematic of the termination showing the switch FET1, the open stub and the inductance associated with transmission line TL2. FIG. 11B shows the capacitive state where the switch FET1 is biased to its off-state and the total capacitance is the sum of the capacitance of the switch FET1 and the capacitance of the stub. FIG. 11C shows the inductive state where the switch FET1 is biased to its on-state, and the inductance is provided by the series transmission line and via to ground. In this state the capacitance of the stub acts as a parasitic which can be absorbed into the design.

Figure 12:
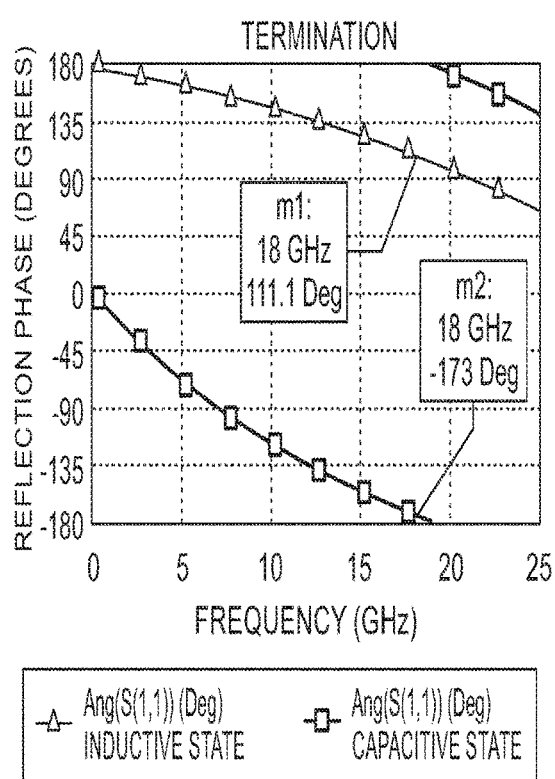
FIG. 12 illustrates phase angles of the two states of FIG. 10.

FIG. 12 shows the phase angles of the two states of the non-ideal termination 400 in FIGS. 9A-9B and FIG. 10, optimized for a 90-degree reflection phase shifter. Note that over appreciable bandwidth the angles track at adjacent to 90 degrees apart corresponding to a 90-degree phase shift. Furthermore, the reflection angle of the inductive state at 0 Hz is 180 degrees as an inductor function as a short circuit, and the reflection angle of the capacitive state is 0 degrees at 0 Hz as a capacitor function as an open circuit.

Figure 13:
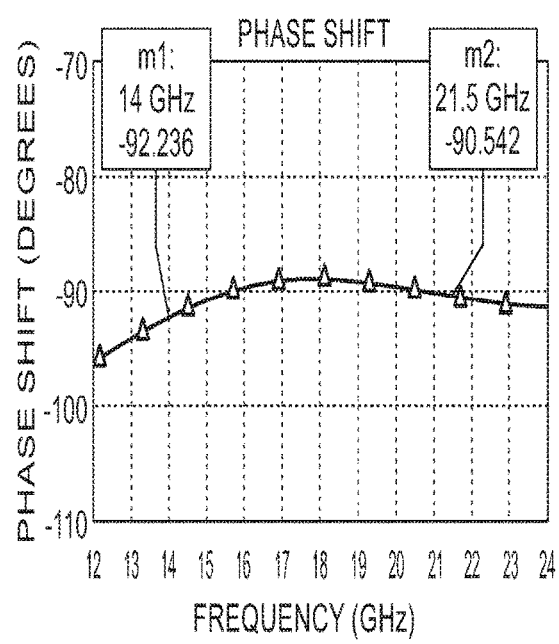
FIG. 13 illustrates the phase response for a 90-degree phase shifter using the phase shifter network of FIG. 7 when physical terminations are attached to a physical coupler as shown in FIG. 9A.

FIG. 13 shows the phase response of a 90-degree example reflection-type phase shifter 300 of FIGS. 9A-9B when the physical terminations 400 are attached to a physical coupler. The phase shift is true/accurate within 6 degrees of 90 degrees from 12 to 24 GHz, a full octave.

Figure 14:
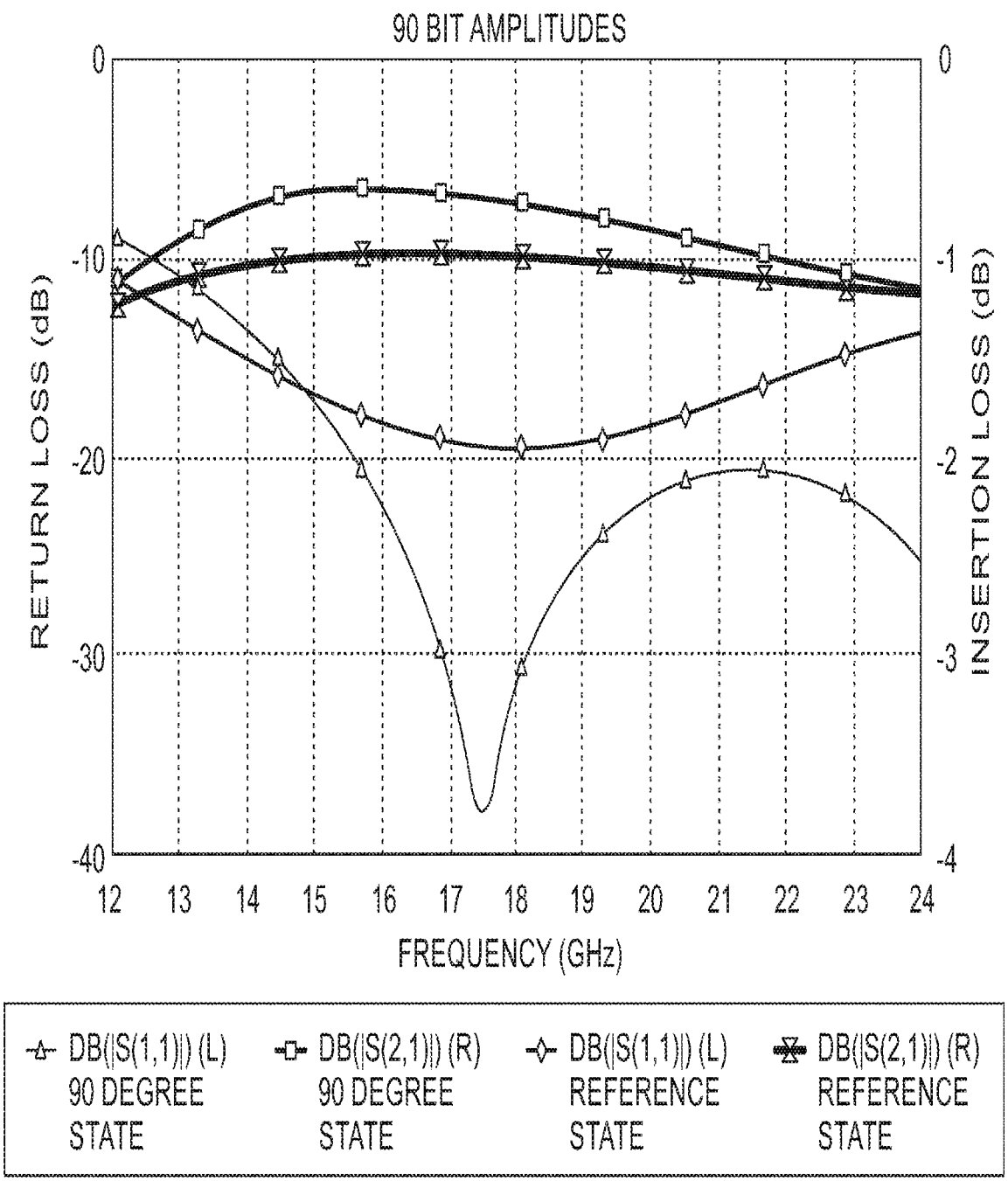
FIG. 14 illustrates 90-degree reflection phase shifter amplitude states for the phase shifter of FIG. 7 when physical terminations are attached to a physical coupler as shown in FIG. 9A.

FIG. 14 shows the amplitude states of the 90-degree example reflection-type phase shifter 300 of the disclosure. The loss is ~1.2 dB or less over an octave bandwidth (12 to 24 GHz). The loss of the two states can be made closer in amplitude by using a higher FOM process, or intentionally adding loss to the capacitive state using a resistor in the termination. In practice, selection can be made in lieu of minimum average loss with a some amount of amplitude error between states.

Because the reflection-type phase shifter 300 of the disclosure uses relatively large switch FETs (on the order of one-millimeter periphery to achieve ~1.5 ohms in on state) to achieve low loss switching, the reflection-type phase shifter 300 can also exhibit high linearity and can be used for phased arrays and could also be used for phase alignment in solid-state power amplifiers.

Specific details are given in the above description to provide a thorough understanding of the embodiments. However, it is understood that the embodiments can be practiced without these specific details. For example, circuits can be shown in block diagrams in order not to obscure the embodiments in unnecessary detail. In other instances, well-known circuits, processes, algorithms, structures, and techniques can be shown without unnecessary detail in order to avoid obscuring the embodiments.

Implementation of the techniques, blocks, steps and means described above can be done in various ways. For example, these techniques, blocks, steps and means can be implemented in hardware, software, or a combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof.

Also, it is noted that the embodiments can be described as a process which is depicted as a flowchart, a flow diagram, a swim diagram, a data flow diagram, a structure diagram, or a block diagram. Although a depiction can describe the operations as a sequential process, many of the operations can be performed in parallel or concurrently. In addition, the order of the operations can be re-arranged. A process is terminated when its operations are completed, but could have additional steps not included in the figure. A process can correspond to a method, a function, a procedure, a subroutine, a subprogram, etc. When a process corresponds to a function, its termination corresponds to a return of the function to the calling function or the main function.

Furthermore, embodiments can be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks can be stored in a machine readable medium such as a storage medium. A code segment or machine-executable instruction can represent a procedure, a function, a subprogram, a program, a routine, a subroutine, a module, a software package, a script, a class, or any combination of instructions, data structures, and/or program statements. A code segment can be coupled to another code segment or a hardware circuit by passing and/or receiving information, data, arguments, parameters, and/or memory contents. Information, arguments, parameters, data, etc. can be passed, forwarded, or transmitted via any suitable means including memory sharing, message passing, token passing, network transmission, etc.

For a firmware and/or software implementation, the methodologies can be implemented with modules (e.g., procedures, functions, and so on) that perform the functions described herein. Any machine-readable medium tangibly embodying instructions can be used in implementing the methodologies described herein. For example, software codes can be stored in a memory. Memory can be implemented within the processor or external to the processor. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" can represent one or more memories for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, and/or various other storage mediums capable of storing that contain or carry instruction (s) and/or data.

While the principles of the disclosure have been described above in connection with specific apparatuses and methods, it is to be clearly understood that this description is made only by way of example and not as limitation on the scope of the disclosure.

What is claimed is:

1. A digital phase shifter, comprising:
an input port configured to receive signals;
an output port configured to transmit phase shifted signals; and
a plurality of transmission lines disposed between the input port and the output port, wherein:
the transmission lines disposed in a ring with a first pair of the transmission lines disposed in series in a first path and a second pair of the transmission lines disposed in series in a second path, and
a selected one of the transmission lines of the first and second pairs comprising a quarter-wave hybrid coupled line.

2. The digital phase shifter as recited in claim 1, wherein:
the transmission lines are a quarter-wave hybrid coupled line electrically disposed between the input port and the output port,
a plurality of terminations electrically connected to the quarter-wave hybrid coupled line at opposing ends, and
each terminations configured to be a shunt inductor in a first state and a shunt capacitor in a second state.

3. The digital phase shifter as recited in claim 1, wherein the selected transmission line comprises a 3-dB hybrid coupled line.

4. The digital phase shifter as recited in claim 1, wherein the selected transmission line comprises a Lange coupler.

5. The digital phase shifter as recited in claim 4, wherein the Lange coupler comprises an RF crossover.

6. The digital phase shifter as recited in claim 5, wherein:
the selected transmission line comprises coupled-ports and through-ports terminated in short-circuits, and
the short-circuits configured to reflect a signal through the selected transmission line with a natural 180-degree phase shift at different frequencies, thereby creating a phase inversion.

7. The digital phase shifter as recited in claim 6, wherein the selected transmission line is configured to combine the signals reflected by the short-circuits to create a 270-degree phase shift, wherein 90-degrees comes from the quarter-wave length of the selected transmission line and 180 degrees coming from the natural 180-degree phase shift.

8. The digital phase shifter as recited in claim 1, wherein the selected transmission line comprises coupled-ports and through-ports terminated in short-circuits, the short-circuits configured to reflect a signal through the selected transmission line with a natural 180-degree phase shift at different frequencies, thereby creating a phase inversion.

9. The digital phase shifter as recited in claim 8, wherein the selected transmission line is configured to combine the signals reflected by the short-circuits to create a 270 degree phase shift, wherein 90 degrees coming from the quarter-wave length of the selected transmission line and 180 degrees coming from the natural 180-degree phase shift.

10. The digital phase shifter as recited in claim 1, wherein the selected transmission line comprising:

four metal strips disposed in parallel to one another, with
a first pair of the metal strips electrically connected to
ground by a first airbridge structure, and
a second pair of the metal strips electrically connected to
ground by a second airbridge structure.

11. The digital phase shifter as recited in claim 1, comprising a pair of FETs configured to steer a signal in different directions around the ring between the input and output ports.

12. The digital phase shifter as recited in claim 11, wherein each FET is disposed in electrical communication with a respective inductor that resonates the capacitance of each respective FET.

13. A reflection-type digital phase shifter, comprising:
an input port configured to receive signals;
an output port; and
a quarter-wave hybrid coupled line electrically disposed between the input port and the output port, wherein:
a plurality of terminations electrically connected to the quarter-wave hybrid coupled line at opposing ends thereof, and
each terminations configured to be a shunt inductor in a first state and a shunt capacitor in a second state.

14. The reflection-type digital phase shifter as recited in claim 13, wherein:
the quarter-wave hybrid coupled line comprises a plurality of transmission lines disposed between the input port and the output port,
the transmission lines disposed in a ring with a first pair of the transmission lines disposed in series in a first path and a second pair of the transmission lines disposed in series in a second path, and
a selected one of the transmission lines of the first and second pairs comprising a quarter-wave hybrid coupled line.

15. The reflection-type digital phase shifter as recited in claim 13, wherein each termination of the plurality of terminations comprising a switch to select between the first state and the second state.

16. The reflection-type digital phase shifter as recited in claim 13, wherein the quarter-wave hybrid coupled line comprising:
four metal strips disposed in parallel to one another, with
a first pair of the four metal strips electrically connected to the input port, and
a second pair of the metal strips electrically connected to the output port.

17. The reflection-type digital phase shifter as recited in claim 16, wherein the first pair of the four metal strips is electrically connected to the input port by an airbridge structure.

18. The reflection-type digital phase shifter as recited in claim 13, wherein the quarter-wave hybrid coupled line comprises a 3-dB coupled line.

19. The reflection type digital phase shifter as recited in claim 13, wherein the quarter-wave hybrid coupled line comprises a Lange coupler.

20. The reflection type digital phase shifter as recited in claim 19, wherein the Lange coupler comprises an RF crossover.

\* \* \* \* \*